United States Patent
Kang

(10) Patent No.: US 8,692,585 B2
(45) Date of Patent: Apr. 8, 2014

(54) SEMICONDUCTOR INTEGRATED CIRCUIT

(75) Inventor: Tae Jin Kang, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 265 days.

(21) Appl. No.: 13/243,351

(22) Filed: Sep. 23, 2011

(65) Prior Publication Data

US 2012/0169380 A1     Jul. 5, 2012

(30) Foreign Application Priority Data

Dec. 29, 2010     (KR) .................. 10-2010-0137925

(51) Int. Cl.
*H03B 1/00*     (2006.01)
*H03K 3/00*     (2006.01)

(52) U.S. Cl.
USPC .................................. 327/108; 327/112

(58) Field of Classification Search
USPC ........... 327/108–112; 326/26, 27, 30, 32, 34, 326/82–83, 85–87
See application file for complete search history.

(56) References Cited

U.S. PATENT DOCUMENTS

| | | | | |
|---|---|---|---|---|
| 7,821,289 B2 * | 10/2010 | Lee | ................................ | 326/27 |
| 7,973,563 B2 * | 7/2011 | Tran et al. | ...................... | 326/86 |
| 2011/0102073 A1 * | 5/2011 | Riho | ............................. | 327/541 |

FOREIGN PATENT DOCUMENTS

KR     100588601 B1     2/2006
KR     1020100107785 A     6/2010

* cited by examiner

*Primary Examiner* — Lincoln Donovan
*Assistant Examiner* — Diana J Cheng
(74) *Attorney, Agent, or Firm* — William Park & Associates Patent Ltd.

(57) ABSTRACT

A semiconductor integrated circuit includes a first output driver configured to drive a first comparison signal, which is generated by comparing a voltage of a pad coupled to an external resistor with an upper-limit reference voltage, according to drivability determined by a pull-up code and a pull-down code, and output the driven signal as first output data; and a second output driver configured to drive a second comparison signal, which is generated by comparing the voltage of the pad with a lower-limit reference voltage, according to the drivability determined by the pull-up code and the pull-down code, and output the driven signal as second output data.

20 Claims, 4 Drawing Sheets

SEMICONDUCTOR INTEGRATED CIRCUIT

CROSS-REFERENCES TO RELATED APPLICATIONS

The present application claims priority under 35 U.S.C 119(a) to Korean Application No. 10-2010-0137925, filed on Dec. 29, 2010, in the Korean intellectual property Office, which is incorporated herein by reference in its entirety set forth in full.

BACKGROUND

In order to improve a data transmission rate of a semiconductor memory device, a synchronous memory device capable of operating in synchronization with a clock signal is being widely used. A synchronous memory device transferring data, for example, on the rising edge of the clock signal is known as a single data rate (SDR) synchronous memory device. Further, a synchronous memory device transferring data on both the rising and falling edges of the clock signal is known as a double data rate (DDR) synchronous memory device. However, the SDR synchronous memory device may not meet speed requirements of a system. Accordingly, the DDR synchronous memory device is being recently used.

The DDR synchronous memory device can implement a band width at least two times larger than the SDR synchronous memory device.

In addition, the swing width of a signal transferred between the semiconductor memory device and a memory controller has been gradually reduced. As the swing width of the signal is reduced, an effect caused by external noise increases, and reflection of signals due to impedance mismatching may become serious at the interface terminal. When impedance mismatching occurs, the signal integrity may deteriorate.

Therefore, an impedance matching circuit called an ODT (On Die Termination) circuit is provided inside a semiconductor memory device. In a known art, at a transmission stage of the ODT circuit, source termination is performed by an output circuit, and at a reception stage thereof, parallel termination is performed by a termination circuit coupled in parallel to a reception circuit coupled to an input pad.

The resistance value of the ODT circuit changes depending on a PVT (Process, Voltage, and Temperature) condition. Therefore, the semiconductor integrated circuit includes an impedance calibration circuit configured to perform a ZQ calibration operation by using an external resistor, in order to control the changing resistance value of the ODT circuit.

FIG. 1 is a diagram illustrating the configuration of a known impedance calibration circuit.

Referring to FIG. 1, the known impedance calibration circuit includes a pad 11 coupled to an external resistor R, comparators 12 and 16, counters 13 and 17, pull-up units 14 and 15, and a pull-down unit 18.

The operation of the impedance calibration circuit configured in such a manner is performed as follows.

First, the comparator 12 compares a pad voltage ZQ with a reference voltage VREF and drives the counter 13 which counts a pull-up code PCODE<1:N> to equalize resistance values of the pull-up units 14 and 15 to that of the external resistor R. When the resistance values of the pull-up units 14 and 15 are equalized to that of the external resistor R by the pull-up code PCODE<1:N> counted by the counter 13, the counter 13 is stopped.

Next, the comparator 16 compares a voltage of a node nd10 with the reference voltage VREF and drives the counter 17 which counts a pull-down code NCODE<1:N> to equalize the resistance value of the pull-down unit 18 to that of the pull-up unit 15. When the resistance value of the pull-down unit 18 is equalized to that of the pull-up unit 15 by the pull-down code NCODE<1:N> counted by the counter 17, the counter 17 stops counting.

As described above, the impedance calibration circuit equalizes the resistance values of the pull-up units 14 and 15 to that of the external resistor R, and then equalizes the resistance value of the pull-down unit 18 to that of the pull-up unit 15. That is, the impedance calibration circuit equalizes the resistance values of the pull-up units 14 and 15 and the pull-down unit 18 to that of the external resistor R having a constant resistance value depending on changes in the PVT condition.

In addition, when a semiconductor integrated circuit including the impedance calibration circuit is packaged, the pad 11 of the impedance calibration circuit is bonded and coupled to a ZQ pin of a package (not illustrated). However, since the ZQ pin cannot be tested after the packaging, it may be difficult to check whether the pad 11 of the impedance calibration circuit is coupled or not.

SUMMARY

An embodiment of the present invention relates to a semiconductor integrated circuit capable of verifying a coupling state of a pad coupled to an external resistor, in order to calibrate impedance eve after packaging.

In an embodiment, a semiconductor integrated circuit includes: a first output driver configured to drive a first comparison signal, which is generated as a result obtained by comparing a voltage of a pad coupled to an external resistor with an upper-limit reference voltage, to drivability set by a pull-up code and a pull-down code, and output the driven signal as first output data; and a second output driver configured to drive a second comparison signal, which is generated as a result obtained by comparing the voltage of the pad with a lower-limit reference voltage, to the drivability set by the pull-up code and the pull-down code, and output the driven signal as second output data.

In an embodiment, a semiconductor integrated circuit includes: a comparison unit configured to compare a voltage of a pad coupled to an external resistor with an upper-limit reference voltage and a lower-limit reference voltage and generate first and second comparison signals; and an output driver unit configured to drive the first and second comparison signals to drivability set by a pull-up code and a pull-down code, which are generated for impedance calibration, and output first and second output data to first and second output pads, respectively.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
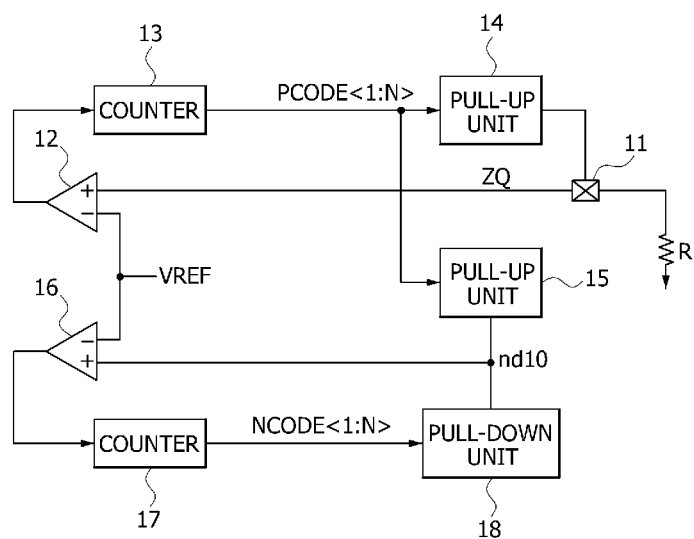
FIG. 1 is a diagram illustrating the configuration of a known impedance calibration circuit.
Figure 2:
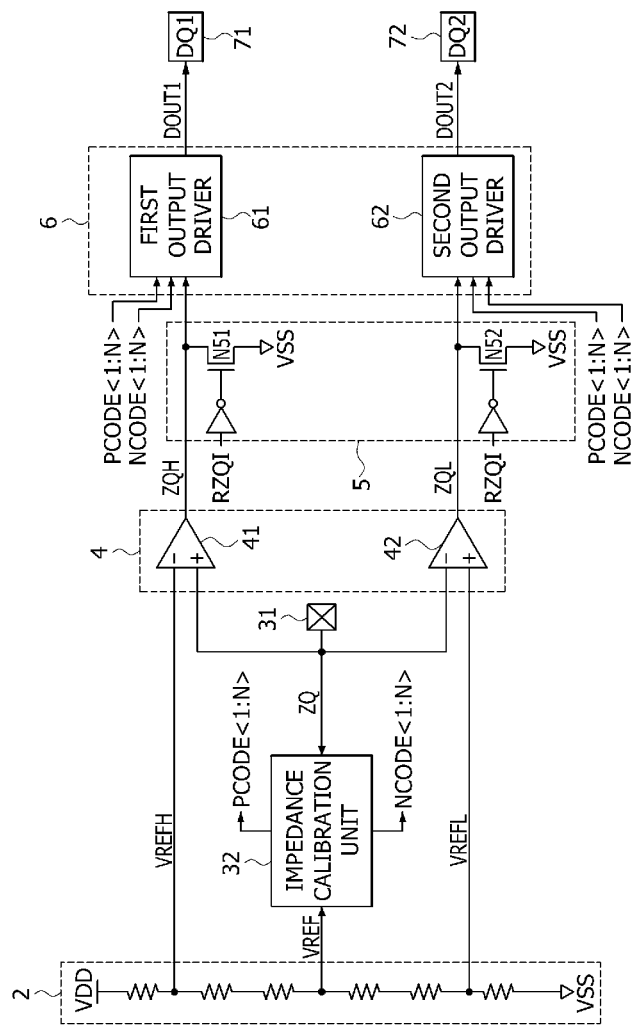
FIG. 2 is a diagram illustrating the configuration of a semiconductor integrated circuit in accordance with an embodiment of the present invention.

FIG. 2 is a diagram illustrating the configuration of a semiconductor integrated circuit in accordance with an embodiment of the present invention.

Referring to FIG. 2, the semiconductor integrated circuit in accordance with an embodiment of the present invention includes a reference voltage generation unit 2, an impedance calibration unit 32, a comparison unit 4, a comparison signal driving unit 5, and an output driver unit 6. The impedance calibration unit 32 is configured to receive a voltage ZQ of a pad 31 coupled to an external resistor and generates a pull-up code PCODE<1:N> and a pull-down code NCODE<1:N>.

The reference voltage generation unit 2 is configured to generate an upper-limit reference voltage VREFH, a reference voltage VREF, and a lower-limit reference voltage VREFL. Here, according to an example, the reference voltage VREF is set to a half level of a power supply voltage VDD, the upper-limit reference voltage VREFH is set to a higher level than the reference voltage VREF, and the lower-limit reference voltage VREFL is set to a lower level than the reference voltage VREF.

The comparison unit 4 includes a first comparator 41 and a second comparator 42. The first comparator 41 is configured to compare the voltage ZQ of the pad 31 with the upper-limit reference voltage VREFH and generate a first comparison signal ZQH, and the second comparator 42 is configured to compare the voltage ZQ of the pad 31 with the lower-limit reference voltage VREFL and generate a second comparison signal ZQL. The first comparison signal ZQH is generated at a logic low level, when the voltage ZQ of the pad 31 is at a higher level than the upper-limit reference voltage VRFEH, and generated at a logic high level, when the voltage ZQ is at a lower level than the upper-limit reference voltage VREFH. Furthermore, the second comparison signal ZQL is generated at a logic high level when the voltage ZQ of the pad 31 is at a higher level than the lower-limit reference voltage VREFL, and generate at a logic low level when the voltage ZQ is at a lower level than the lower-limit reference voltage VREFL.

The comparison signal driving unit 5 includes NMOS transistors N51 and N52 configured to drive the first and second comparison signals ZQH and ZQL to a ground voltage. A test signal RZQI is enabled to check the coupling state of the pad 31. According to an example, the comparison signal driving unit 5 drives the first and second comparison signals ZQH and ZQL to the ground voltage, in a state in which the test signal RZQI is at a logic low level because a test was not performed. Depending on embodiments, the test signal RZQI may be generated inside the semiconductor integrated circuit or applied from outside.

The output driver unit 6 includes a first output driver 61 and a second output driver 62. The first output driver 61 is configured to drive the first comparison signal ZQH according to drivability determined by the pull-up code PCODE<1:N> and the pull-down code NCODE<1:N>, and output first output data DOUT1 to a first output pad 71. The second output driver 62 is configured to drive the second comparison signal ZQL according to the drivability determined by the pull-up code PCODE<1:N> and the pull-down code NCODE<1:N>, and output second output data DOUT2 to a second output pad 72.

Figure 3:
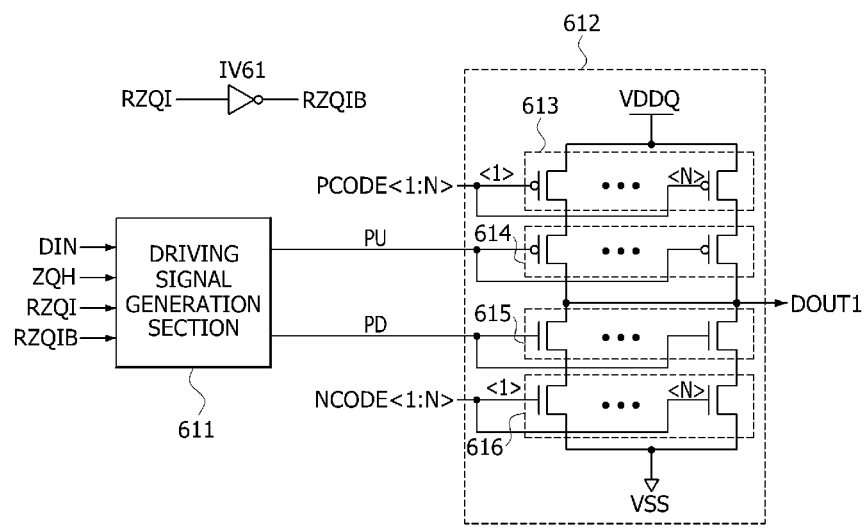
FIG. 3 is a diagram illustrating the configuration of a first output driver included in the semiconductor integrated circuit of FIG. 2.

Referring to FIG. 3, the first output driver 61 includes a driving signal generation section 611 and a driving section 612. The driving signal generation section 611 is configured to selectively buffer input data DIN or the first comparison signal ZQH in response to the test signal RZQI, and generate a pull-up driving signal PU and a pull-down driving signal PD. The driving section 612 is configured to drive the first output data DOUT1 according to the drivability determined by the pull-up code PCODE<1:N> and the pull-down code NCODE<1:N> in response to the pull-up driving signal PU and the pull-down driving signal PD. The driving section 612 includes a pull-up driver 614, a pull-down driver 615, a first driving controller 613, and a second driving controller 616. The pull-up driver 614 is configured to pull-up drive the first output data DOUT1 in response to the pull-up driving signal PU. The pull-down driver 615 is configured to pull-down drive the first output data DOUT1 in response to the pull-down driving signal PD. The first driving controller 613 is configured to control the drivability of the pull-up driving unit 614 in response to the pull-up code PCODE<1:N>. The second driving controller 616 is configured to control the drivability of the pull-down driving unit 615 in response to the pull-down code NCODE<1:N>.

Figure 4:
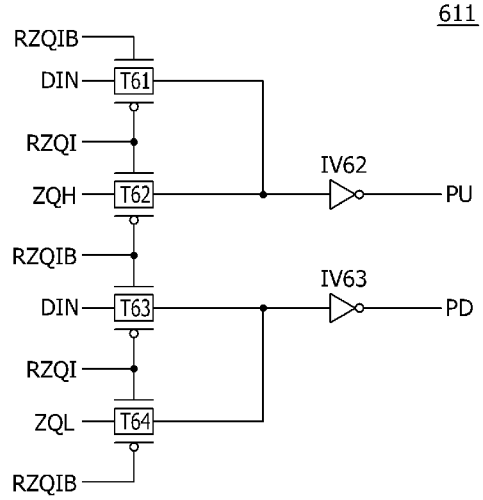
FIG. 4 is a circuit diagram illustrating an example of a driving signal generation section included in the first output driver of FIG. 3.
Figure 5:
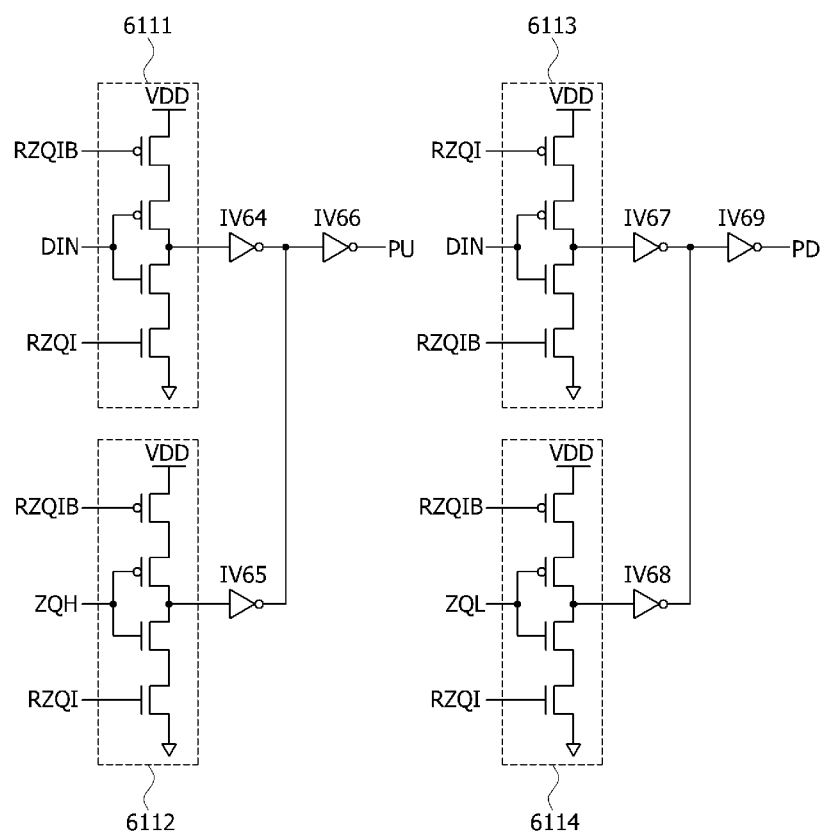
FIG. 5 is a circuit diagram illustrating another example of a driving signal generation section included in the first output driver of FIG. 3.

The driving signal generation section 611 may be implemented in accordance with various embodiments as illustrated in FIGS. 4 and 5. Referring to FIG. 4, the driving signal generation section 611 may include first to fourth transmission gates T61 to T64 and inverters IV62 and IV63. The first to fourth transmission gates T61 to T64 are configured to be selectively turned on in response to the test signal RZQI and an inverse test signal RZQIB. The first and second transmission gates T61 and T62 selectively transmit the input data DIN or the first comparison signal ZQH. Also, the third and fourth transmission gates T63 and T64 selectively transmit the input data DIN or the second comparison signal ZQL. The inverter IV62 is configured to buffer output signals of the first and second transmission gates T61 and T62 and output the pull-up driving signal PU. The inverter IV63 is configured to buffer output signals of the third and fourth transmission gates T63 and T64 and output the pull-down driving signal PD. Furthermore, referring to FIG. 5, the driving signal generation section 611 may include first to fourth buffers 6111 to 6114 and inverters IV64 to IV69 which are selectively driven in response to the test signal RZQI and the inverse test signal RZQIB, and buffer the input data DIN or the first comparison signal ZQH.

In the semiconductor integrated circuit configured in the above-described manner, a test operation for checking a coupling state of the pad 31 is performed as follows.

When the test signal RZQI is applied at a logic high level to check the coupling state of the pad 31, the NMOS transistors N51 and N52 of the comparison signal driving unit 5 are turned off, and the comparison unit 4 compares the voltage ZQ of the pad 31 with the upper-limit reference voltage VREFH and the lower-limit reference voltage VREFL, and generates the first comparison signal ZQH and the second comparison signal ZQL.

The levels of the first and second comparison signals ZQH and ZQL generated by the comparison unit 4 are determined by the coupling state of the pad 31. That is, when the pad 31 is coupled to a power supply voltage VDD, the first comparison signal ZQH is generated at a logic low level, and the second comparison signal ZQL is generated at a logic high level. When the pad 31 is coupled to a ground voltage VSS, the first comparison signal ZQH is generated at a logic high level, and the second comparison signal ZQL is generated at a logic low level. Also, when the pad 31 is not coupled to the power supply voltage VDD or the ground voltage VSS, the pad 31 is calibrated to a level between the upper-limit reference voltage VREFH and the lower-limit reference voltage VREFL by the impedance calibration unit 32. Therefore, the first and second comparison signals ZQH and ZQL are generated at a logic high level.

The first and second comparison signals ZQH and ZQL generated in such a manner are driven by the output driver unit 6, and outputted to the first and second output pads 71 and 72. Here, the drivability of the output driver unit 6 is determined by the pull-up code PCODE<1:N> and the pull-down code NCODE<1:N>.

As described above, when the test signal RZQI is generated at a logic high level, the semiconductor integrated circuit may verify the coupling state of the pad 31 by checking the levels of the first and second comparison signals ZQH and ZQL outputted to the first and second output pads 71 and 72, respectively. That is, when the first comparison signal ZQH outputted from the first output pad 71 is at a logic low level and the second comparison signal ZQL outputted from the second output pad 72 is at a logic high level, it is possible to determine that the pad 31 is coupled to the power supply voltage VDD. Furthermore, when the first comparison signal ZQH outputted from the first output pad 71 is at a logic high level and the second comparison signal ZQL outputted from the second output pad 72 is at a logic low level, it is possible to determine that the pad 31 is coupled to the ground voltage VSS. Furthermore, when the first comparison signal ZQH outputted from the first output pad 71 is at a high low level and the second comparison signal ZQL outputted from the second output pad 72 is at a logic high level, it is possible to determine that the pad 31 is not coupled to the power supply voltage VDD or the ground voltage VSS, but normally calibrated by the impedance calibration unit 32.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor integrated circuit comprising:
   a first output driver configured to drive a first comparison signal, which is generated by comparing a voltage of a pad coupled to an external resistor with an upper-limit reference voltage, according to drivability determined by a pull-up code and a pull-down code, and output the driven signal as first output data; and
   a second output driver configured to drive a second comparison signal, which is generated by comparing the voltage of the pad with a lower-limit reference voltage, according to the drivability determined by the pull-up code and the pull-down code, and output the driven signal as second output data,
   wherein the first output driver comprises a driving signal generation section configured to selectively buffer input data or the first comparison signal in response to a test signal and generate a pull-up driving signal and a pull-down driving signal, and a driving section configured to drive the first output data in response to the pull-up driving signal and the pull-down driving signal according to drivability determined by the pull-up code and the pull-down code.

2. The semiconductor integrated circuit of claim 1, wherein the driving signal generation section comprises:
   a first transmission element configured to transmit the input data in response to the test signal;
   a second transmission element configured to transmit the first comparison signal in response to the test signal; and
   a first buffer configured to buffer the signal transmitted from the first or second transmission element and generate the pull-up driving signal.

3. The semiconductor integrated circuit of claim 2, wherein the driving signal generation section further comprises:
   a third transmission element configured to transmit the input data in response to the test signal;
   a fourth transmission element configured to transmit the first comparison signal in response to the test signal; and
   a second buffer configured to buffer the signal transmitted from the third or fourth transmission element and generate the pull-down driving signal.

4. The semiconductor integrated circuit of claim 1, wherein the driving signal generation section comprises:
   a first buffer section configured to buffer the input data in response to the test signal;
   a second buffer section configured to buffer the first comparison signal in response to the test signal; and
   a first buffer configured to buffer output signals of the first and second buffer sections and generate the pull-up driving signal.

5. The semiconductor integrated circuit of claim 4, wherein the driving signal generation section further comprises:
   a third buffer section configured to buffer the input data in response to the test signal;
   a fourth buffer section configured to buffer the first comparison signal in response to the test signal; and
   a second buffer configured to buffer output signals of the third and fourth buffer sections and generate the pull-down driving signal.

6. The semiconductor integrated circuit of claim 1, wherein the second output driver comprises:
   a driving signal generation section configured to selectively buffer input data or the second comparison signal in response to a test signal and generate a pull-up driving signal and a pull-down driving signal; and
   a driving section configured to drive the second output data in response to the pull-up driving signal and the pull-down driving signal according to drivability determined by the pull-up code and the pull-down code.

7. The semiconductor integrated circuit of claim 6, wherein the driving signal generation section comprises:
   a first transmission element configured to transmit the input data in response to the test signal;
   a second transmission element configured to transmit the second comparison signal in response to the test signal; and
   a first buffer configured to buffer the signal transmitted from the first or second transmission element and generate the pull-up driving signal.

8. The semiconductor integrated circuit of claim 7, wherein the driving signal generation section further comprises:
   a third transmission element configured to transmit the input data in response to the test signal;
   a fourth transmission element configured to transmit the second comparison signal in response to the test signal; and a second buffer configured to buffer the signal transmitted from the third or fourth transmission element and generate the pull-down driving signal.

9. The semiconductor integrated circuit of claim 6, wherein the driving signal generation section comprises:
a first buffer section configured to buffer the input data in response to the test signal;
a second buffer section configured to buffer the second comparison signal in response to the test signal; and
a first buffer configured to buffer output signals of the first and second buffer sections and generate the pull-up driving signal.

10. The semiconductor integrated circuit of claim 9, wherein the driving signal generation section further comprises:
a third buffer section configured to buffer the input data in response to the test signal;
a fourth buffer section configured to buffer the second comparison signal in response to the test signal; and
a second buffer configured to buffer output signals of the third and fourth buffer sections and generate the pull-down driving signal.

11. A semiconductor integrated circuit comprising:
a comparison unit configured to compare a voltage of a pad coupled to an external resistor with an upper-limit reference voltage and a lower-limit reference voltage and generate first and second comparison signals;
an output driver unit configured to drive the first and second comparison signals according to drivability determined by a pull-up code and a pull-down code, which are generated for impedance calibration, and output first and second output data to first and second output pads, respectively; and
a comparison signal driving unit configured to drive the first and second comparison signals to a ground voltage in response to a test signal.

12. The semiconductor integrated circuit of claim 11, wherein the comparison unit comprises:
a first comparator configured to compare the voltage of the pad with the upper-limit reference voltage and generate the first comparison signal; and
a second comparator configured to compare the voltage of the pad with the lower-limit reference voltage and generate the second comparison signal.

13. The semiconductor integrated circuit of claim 11, further comprising:
a reference voltage generation unit configured to generate the upper-limit reference voltage, the lower-limit reference voltage, and a reference voltage; and
an impedance calibration unit configured to receive the reference voltage and the voltage of the pad, and generate the pull-up code and the pull-down code.

14. The semiconductor integrated circuit of claim 11, wherein the output driver unit comprises:
a first output driver configured to drive the first comparison signal according to the drivability determined by the pull-up code and the pull-down code, and output the driven signal as the first output data; and
a second output driver configured to drive the second comparison signal according to the drivability determined by the pull-up code and the pull-down code, and output the driven signal as the second output data.

15. The semiconductor integrated circuit of claim 14, wherein the first output driver comprises:
a driving signal generation section configured to selectively buffer input data or the first comparison signal in response to a test signal and generate a pull-up driving signal and a pull-down driving signal; and
a driving section configured to drive the first output data in response to the pull-up driving signal and the pull-down driving signal according to drivability determined by the pull-up code and the pull-down code.

16. The semiconductor integrated circuit of claim 15, wherein the driving signal generation section comprises:
a first transmission element configured to transmit the input data in response to the test signal;
a second transmission element configured to transmit the first comparison signal in response to the test signal; and
a first buffer configured to buffer the signal transmitted from the first or second transmission element and generate the pull-up driving signal.

17. The semiconductor integrated circuit of claim 16, wherein the driving signal generation section further comprises:
a third transmission element configured to transmit the input data in response to the test signal;
a fourth transmission element configured to transmit the first comparison signal in response to the test signal; and
a second buffer configured to buffer the signal transmitted from the third or fourth transmission element and generate the pull-down driving signal.

18. The semiconductor integrated circuit of claim 15, wherein the driving signal generation section comprises:
a first buffer section configured to buffer the input data in response to the test signal;
a second buffer section configured to buffer the first comparison signal in response to the test signal; and
a first buffer configured to buffer output signals of the first and second buffer sections and generate the pull-up driving signal.

19. The semiconductor integrated circuit of claim 18, wherein the driving signal generation section further comprises:
a third buffer section configured to buffer the input data in response to the test signal;
a fourth buffer section configured to buffer the first comparison signal in response to the test signal; and
a second buffer configured to buffer output signals of the third and fourth buffer sections and generate the pull-down driving signal.

20. The semiconductor integrated circuit of claim 14, wherein the second output driver comprises:
a driving signal generation section configured to selectively buffer input data or the second comparison signal in response to a test signal and generate a pull-up driving signal and a pull-down driving signal; and
a driving section configured to drive the second output data in response to the pull-up driving signal and the pull-down driving signal according to drivability determined by the pull-up code and the pull-down code.

* * * * *